United States Patent [19]

Park et al.

[11] Patent Number: 4,961,054
[45] Date of Patent: Oct. 2, 1990

[54] GRADIENT CURRENT SPEED-UP CIRCUIT FOR HIGH-SPEED NMR IMAGING SYSTEM

[75] Inventors: John N. Park, Rexford; Otward M. Mueller, Ballston Lake; Peter B. Roemer, Schenectady, all of N.Y.

[73] Assignee: General Electric Company, Schenectady, N.Y.

[21] Appl. No.: 376,074

[22] Filed: Jul. 6, 1989

[51] Int. Cl.⁵ ............................................. G01R 33/20
[52] U.S. Cl. ..................................... 324/322; 363/132
[58] Field of Search ............... 363/43, 93, 132, 154; 324/300, 307, 309, 318, 319, 320, 322

[56] References Cited

U.S. PATENT DOCUMENTS

| | | | |
|---|---|---|---|
| 4,667,159 | 5/1987 | Hodsoll et al. | 324/322 |
| 4,701,711 | 10/1987 | Willard et al. | 324/322 |
| 4,733,342 | 3/1988 | Mueller et al. | 324/322 |
| 4,820,986 | 4/1989 | Mansfield et al. | 324/322 |

Primary Examiner—Michael J. Tokar
Attorney, Agent, or Firm—Geoffrey H. Krauss; James C. Davis, Jr.; Marvin Snyder

[57] ABSTRACT

A gradient current speed-up circuit, for use in a higher-speed NMR imaging system with a gradient power amplifier and an associated gradient coil, has an energy-storage element, with an inductance typically between 5 and 20 times the inductance of the associated gradient coil. A plurality of semiconductor switching elements receive the current output of the energy-storage element; and the associated gradient coil is connected between selected ones of these semiconductors devices. The semiconductor devices are turned on and off in selected patterns, to cause the energy-storage element current to be suddenly applied to and removed from flow through the associated gradient coil.

12 Claims, 2 Drawing Sheets

GRADIENT CURRENT SPEED-UP CIRCUIT FOR HIGH-SPEED NMR IMAGING SYSTEM

BACKGROUND OF THE INVENTION

The present invention relates to nuclear magnetic resonance (NMR) imaging systems and, more particularly, to a novel circuit for speeding up the rise and fall times of current pulses utilized to generate gradient magnetic fields in such systems.

It is now well known that NMR imaging and/or spectroscopy systems require at least one power amplifier for each magnetic gradient field direction utilized. These gradient power amplifiers provide the current which generates the magnetic gradient fields, typically in the X,Y and Z dimensions of a Cartesian coordinate system, as necessary to obtain desired spatial resolution. Typically, the gradient power amplifiers are modified forms of linear high-fidelity audio power amplifiers, which typically generate current pulses in the 100-200 ampere range; the relatively good linearity, rise times and fall times of these amplifiers are obtained by the application of relatively high voltages and feedback to output stages containing as many as 100 bipolar transistors. These power amplifiers are relatively inefficient (having typical efficiencies of less than 15%). As higher imaging speeds are utilized, greater stress is applied to existing gradient power amplifiers, as faster rise times require greater currents (in the same gradient coil inductance) and so increasingly higher voltages and more power dissipation are all required. It is therefore highly desirable to provide a current amplifier circuit, preferably capable of being added to an NMR system between an existing gradient power amplifier and its associated gradient coil, for providing the faster pulse current waveform rise and fall times necessary for higher-speed imaging use.

BRIEF SUMMARY OF THE INVENTION

In accordance with the invention, a gradient current speed-up circuit for use in a higher-speed NMR imaging system having a gradient power amplifier and an associated gradient coil, comprises: an energy-storage element, having an inductance typically between 5 and 20 times the inductance of the associated gradient coil; a plurality of semiconductor switching elements receiving the current output of the energy-storage element; means for connecting the associated gradient coil between selected ones of the semiconductors devices; and means for turning the semiconductor devices on and off in selected patterns, to cause the energy-storage element current to be suddenly applied to and removed from flow through the associated gradient coil.

In a presently preferred embodiment, four insulated-gate bipolar transistors (IGBTs) are utilized in a full-bridge configuration. An optional fifth IGBT can be utilized to abruptly remove current flow through the associated gradient coil and reduce current fall time.

Accordingly, it is an object of the present invention to provide a novel gradient current speed-up circuit for use in NMR imaging and spectroscopy systems.

This and other objects of the present invention will become apparent upon reading of the following detailed description, when considered in conjunction with the associated drawings.

DETAILED DESCRIPTION OF THE INVENTION

Figure 1:
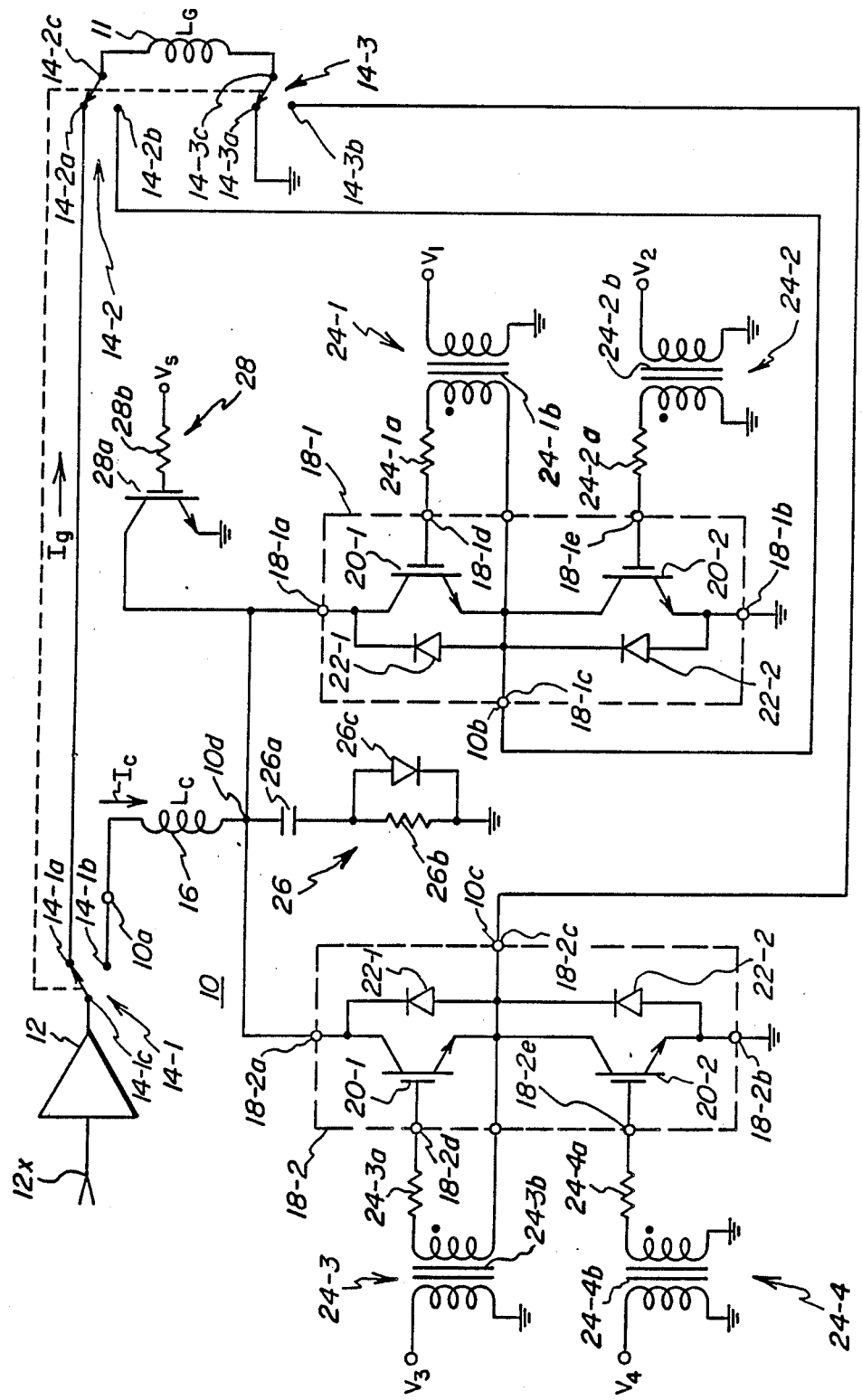
FIG. 1 is a schematic block diagram of a single directional-gradient-magnetic-field-providing portion of a NMR system, and of a presently preferred embodiment of the novel circuit of invention.

Referring initially to FIG. 1, a presently preferred embodiment of our gradient current speed-up circuit 10 is utilized with an associated gradient coil 11, for providing the magnetic-field gradient in one (of a plurality) of directions within the operating volume of a NMR imaging and/or spectroscopy system. Gradient coil 11 is normally driven by a gradient power amplifier 12. A set of configuration switches 14 may be utilized to either connect the gradient coil 11 between the output of existing gradient power amplifier 12 and system common potential, or to insert the speed-up circuit 10 between amplifier 12 and coil 11. Thus, a first switching means 14-1 has a first selectable contact 14-1a connected to a first selectable contact 14-2a of a second switching means 14-2, and has a second selectable contact 14-1b connected to an input 10a of the speed-up circuit. The first switching means common terminal 14-1c is connected to the output of amplifier 12. The second switching means 14-2 second selectable contact 14-2b is connected to a first output 10b of the speed-up circuit, while the second switching means common contact 14-2c is connected to a first end of the gradient coil 11. The remaining end of the gradient coil is connected to the common contact 14-3c of a third switching means 14-3, having a first selectable contact 14-3a connected to system common potential, and a second selectable contact 14-3b connected to a second speed-up circuit output 10c. Thus, in normal use, with the switching means 14 configured as shown, a gradient coil current $I_g$ is caused to flow through the gradient coil inductance $L_G$, directly from the output of existing system gradient power amplifier 12; the characteristics of the gradient magnetic field thus formed is determined by the characteristics of the gradient current $I_g$. All three switch means are thrown to the opposite position to connect the second selectable contact 14-ib to the common contact 14-ic, where $1 \leq i \leq 3$, to utilize the gradient current speed-up circuit 10.

In accordance with the present invention, the gradient current speed-up circuit 10 includes an energy-storing inductive element 16 having an inductance $L_C$ which is greater than the associated gradient coil inductance $L_G$; ideally, $L_c$ is between five and twenty times $L_G$. The presence of the high-inductance element 16 in series with amplifier 12 output causes a substantially-constant current $I_c$ to be sourced into a circuit node 10d, soon after the amplifier 12 is turned on. Current $I_c$ must flow to circuit common potential, as through at least one controllable conduction means 18. Here, a pair of paralleled controllable-conduction means 18-1 and 18-2 are utilized. Each controllable-conduction means 18 contains at least one controllable solid-state device 20, and such other elements, e.g. reverse-conduction diodes 22 and the like, as are necessary for proper operation, protection, etc. Illustratively, each means 18 contains series-connected first and second insulated-gate bipolar transistors (IGBT) 20-1 and 20-2, connected between a means input 18-1a or 18-2a, and a means common potential connection 18-1b or 18-2b. A reverse-conduction diode 22-1 or 22-2 is connected across the collector-emitter circuit of an associated IGBT 20-1 or 20-2; diodes 22 may be integrally formed with the associated IGBT, or may be separate diffusions or elements within a common package. The junction between the first and second IGBTs forms an associated means center connection 18-1c or 18-2c, at which the speed-up circuit gradient coil output 10b or 10c is respectively taken. Associated with each controllable-conduction device 20 is a driving means 24; a first driving means 24-1, comprising a gate impedance 24-1a and an isolation transformer 24-1b, couples a first actuating signal $V_1$ across the control input (the gate-source circuit) of IGBT 20-1, and thus between terminals 18-1d and 18-1c. Similarly, a second driving means 24-2 has a second impedance 24-2a and another transformer means 24-2b, to provide the second actuating signal $V_2$ between the second device input terminal 18-1e and terminal 18-1b. It will be seen that third and fourth driving means 24-3 and 24-4, respectively, having impedance 24-3a or 24-4a and transformer means 24-3 or 24-4, respectively, transform third and fourth driving signals $V_3$ or $V_4$ to appear across the respective gate-source terminals 18-2d and 18-2c or 18-2e and 18-2b, of the respective controlled-conductor devices 20-1 or 20-2, of second control-conduction means 18-2.

Snubber means 26 is connected between node 10d and common potential, to limit the high voltage generated at node 10d due to the rapid switching of the current $I_C$ into and out of the associated gradient coil inductance $L_G$. Snubber means 26 includes a capacitive element 26a in series with a dissipative element 26b, between node 10d and common potential, and a unidirectionally-conducting diode element 26c connected in parallel with dissipative element 26b.

Advantageously, a fifth IBGT 28 has its controlled-conduction circuit connected from the energy-storage element 16 to circuit common potential, i.e. with its collector electrode connected to node 10d and its source electrode connected to common potential, and with its insulated gate electrode connected through a current-limiting impedance 28b, to receive a short-circuit-actuating signal $V_s$.

Figure 1A:
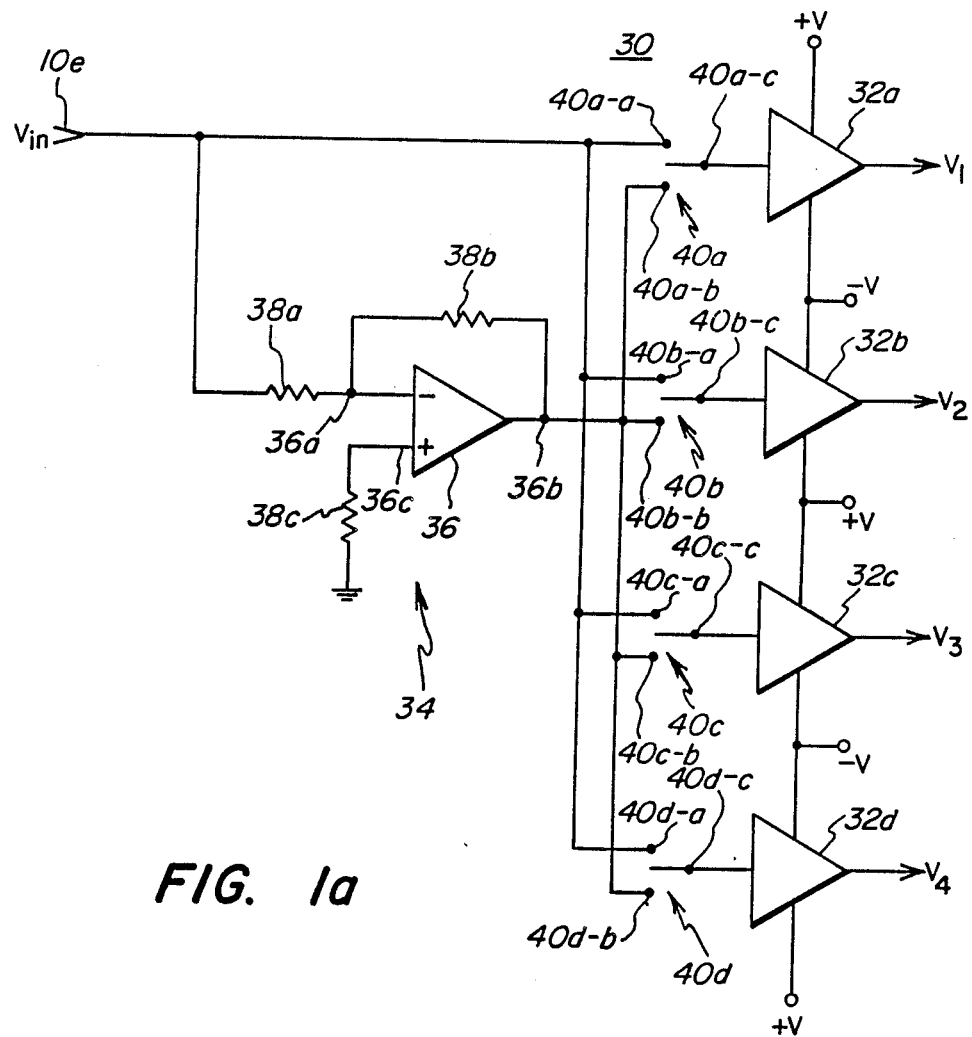
FIG. 1a is a schematic block diagram of one presently preferred embodiment of a driver circuit for providing drive control signals to the gradient speed-up circuit of FIG. 1.

Referring now particularly to FIG. 1a, the actuating signals $V_1$–$V_4$ for the illustrated full-bridge speed-up circuit can be provided with greatest versatility by use of a driving circuit 30 which utilizes driver amplifiers 32 of number equal to the number of individual actuating signals to be provided. Thus, here four individual driver amplifiers 32a–32d are utilized, with the output of each driver amplifier 32j, where $1 \leq j \leq 4$, providing the actuating signal $V_j$. Presently, we prefer that each driver amplifier 32 be a power operational amplifier type PA09 (available from APEX Semiconductor Co.) and the like, each receiving a positive operating potential $+V$ and a negative operating potential $-V$. The power operational amplifier inputs receive either the signal at a circuit control signal input 10e, or the inverse of that signal as provided by a signal-polarity-inverting means 34. Means 34 utilizes an operational amplifier 36, having its inverting input 36a connected to circuit input 10e via an input resistor 38a, and connected to a feedback resistor 38b to the operational amplifier output 36b. The operational amplifier non-inverting 36c is connected to common potential through a stabilization resistor 38c. The signal at input 10e is connected to first selectable terminals 40a—a, . . . , 40d-a of each of four switch means 40a-40d, each having a second selectable terminal 40a -b, . . . , 40d -b receiving the inverted-polarity input signal from means 34. The common output 40a -c, . . . , 40d -c of one of switch means 40 is connected to the input of an associated driver amplifier 32a, . . . , 32d.

In a typical operational sequence, the control switches 40 are all initially operated so that input 10e is connected to all of the amplifier 32 inputs; the speed-up circuit input control signal $V_{in}$ is enabled, to cause each of IGBTs 20-1 and 20-2 of both of the control-conduction means 18-1 and 18-2 to conduct. These means may be type MG100N2YS1 units available from Toshiba and the like manufacturers. An enabling signal is provided at the control input 12x of the power amplifier 12, to cause a desired level (say, 25 amperes) of current $I_c$ to flow into the energy-storage inductance 16 (configuration switches 14 having previously been set to connect each second selectable contact 14-ib2 to the associated common contact 14-ic, so that gradient current speed-up circuit 10 can be utilized). The substantially constant current $I_c$ flows into node 10d and thence through the saturated devices 20-1 and 20-2 of the paralleled modules 18-1 and 18-2, to circuit common potential. Auxiliary short-circuiting device 28a can be operated, by suitable shorting potential $V_s$, to provide an additional parallel current path. Assuming that the saturation resistance of lower devices 20-2 are substantially equal, the potential at speed-up circuit outputs 10b and 10c is substantially equal, so that there is substantially no potential appearing across gradient coil 11, and there is substantially no flow of current through the gradient coil. At the time for initiating a flow of gradient coil current, a diametrically-opposed pair of devices 20 (as well as device 28, if used) are driven into the open-circuit condition, with the remaining diametrically-opposed pair of device 20 remaining in the saturated condition; this may be accomplished by operating suitable ones of switching means 40, which can be high-speed semiconductor devices. Now, all of the substantially constant current $I_c$ flows through gradient coil 11. The direction of gradient coil current flow is established by the selection of the diametrically-opposed pair of devices 20 remaining in the saturated condition. Thus, if control voltages $V_1$ and $V_4$ are withdrawn, so that both device 20-1 in module 18-1 and device 20-2 in module 18-2 are placed in the cut-off condition (with drive signals $V_2$ and $V_3$ remaining present, so that device 20-2 in module 18-1 and device 20-1 in module 18-2 remain in the saturated condition), current flows from node 10d, through device 20-1 of module 18-2, through output 10c, through switching means 14-3 and upwardly through the gradient coil 11, thence through switching means 14-2, into output 10b and through device 20-2 of module 18-1, to circuit common potential; this establishes a gradient magnetic field of slope negative to the slope which would occur if the first and fourth driving signals $V_1$ and $V_4$ remain present and the second and third driving signals $V_2$ and $V_3$ were removed. The short-duration pulse of gradient current ends when the driving signals for at least one of the parallel legs are enabled, to again provide a very low impedance path from node 10d to circuit common potential, removing current flow from a path through coil 11. Immediately thereafter, gradient power amplifier 12 is disabled, to cease providing current $I_c$. It will be recognized that rapid change of large currents, even through the relatively small gradient coil inductance (typically of less than 1 millihenry) can still generate relatively high voltages, which are of use in producing desirable very short current rise and fall times and in obtaining current pulses with very "flat" tops. Use of devices 20 having voltage ratings of 800 or 1000 volts is preferable. It will also be understood that, in case of switching faults, even higher voltages could be applied to the module current input terminals 18-1a and 18-2a, and thus across the series-connected devices 20, or across the single device 28a. For example, if a switching fault occurs and all of devices 20/28 are suddenly turned off, while a current $I_c$ is flowing, the node 10d voltage $V_{10d} = L_c(\Delta I_c/\Delta t)$; snubber means 26 is provided, and the component values selected, to limit the node 10d maximum voltage to a value less than the maximum voltage at which any of devices 20/28a suffer damage.

While the present invention has been described with respect one presently preferred embodiment thereof, many variations and modifications will now become apparent to those skilled in the art. It is our intent, therefore, to be limited only by the scope of the appending claims, and not by the specific details and instrumentalities presented by way of description of the presently preferred embodiment of the present application.

What we claim is:

1. A gradient current speed-up circuit for use in a higher-speed NMR imaging system having a gradient power amplifier and an associated gradient coil, comprises: an energy-storage element, having an inductance greater than the inductance of the associated gradient coil, and receiving a current $I_c$ from said amplifier; a plurality of semiconductor switching devices receiving the $I_c$ current output of the energy-storage element; means for connecting the associated gradient coil between selected ones of the semiconductors devices; and means for turning the semiconductor devices on and off in selected patterns, to cause the energy-storage element current $I_c$ to be suddenly applied to and removed from flow through the associated gradient coil.

2. The circuit of claim 1, further comprising switching means for selectably connecting and disconnecting said circuit from between said amplifier and said gradient coil.

3. The circuit of claim 1, wherein said energy-storage element inductance is between about 5 and about 20 times the inductance of the gradient coil.

4. The circuit of claim 1, further including snubber means for preventing a voltage, generated across the switching devices, from exceeding a preselected value.

5. The circuit of claim 1, wherein the turning means includes means for separately driving each switching device, responsive to a common control input signal.

6. The circuit of claim 1, further comprising additional switching means in parallel connection with said plurality of switching devices, for separately conducting at least some of the current Ic around said gradient coil.

7. The circuit of claim 7, wherein said additional switching means causes said at least some current to also not flow through any of said switching devices.

8. The circuit of claim 7, wherein said additional switching means includes an IGBT.

9. The circuit of claim 1, wherein each of said plurality of switching devices is an IGBT.

10. The circuit of claim 1, wherein four of said switching devices are arranged in a full-bridge configuration receiving said current $I_c$.

11. The circuit of claim 10, wherein each of said four switching devices is an IGBT.

12. The circuit of claim 1, wherein each of said plurality of switching devices is a series-connected plurality of IGBTs.

* * * * *